United States Patent [19]
Lee et al.

[11] Patent Number: 6,015,308
[45] Date of Patent: Jan. 18, 2000

[54] DOCKING STATION FOR A NOTEBOOK COMPUTER

[75] Inventors: Chia-Chun Lee; Ming-Hsun Chou; Jui-Jung Huang; Chih-Wen Chiang, all of Taipei, Taiwan

[73] Assignee: Compal Electronics, Inc., Taiwan

[21] Appl. No.: 09/240,595

[22] Filed: Feb. 1, 1999

[51] Int. Cl.$^7$ .................................................. H01R 13/62
[52] U.S. Cl. ........................... 439/155; 439/160; 361/686
[58] Field of Search .................................... 439/155, 159, 439/160, 372, 266; 361/686, 754, 684, 726, 747, 759, 798, 801; 403/322.1, 322.4; 292/11, 26

[56] References Cited

U.S. PATENT DOCUMENTS

| | | | |
|---|---|---|---|
| 5,283,714 | 2/1994 | Tsai et al. | 439/160 |
| 5,561,589 | 10/1996 | Mesfin et al. | 361/686 |
| 5,580,182 | 12/1996 | Lin | 403/325 |
| 5,619,398 | 4/1997 | Harrison et al. | 361/686 |
| 5,870,283 | 2/1999 | Maeda et al. | 361/686 |

*Primary Examiner*—Renee S. Luebke
*Assistant Examiner*—Hae Moon Hyeon
*Attorney, Agent, or Firm*—Pillsbury Madison & Sutro LLP

[57] ABSTRACT

A docking station for a notebook computer includes a housing and an ejector device. The housing has a front wall disposed adjacent to and parallel to a rear wall of the notebook computer. The front wall is formed with an ejector opening. The housing is further formed with an access opening. The ejector device includes an linking arm, an ejecting member, an operating member, and a biasing member. The linking arm is disposed in the housing, and is movable in the housing in a longitudinal direction between operated and non-operated positions. The linking arm has a connecting end and an operating end accessible via the access opening to permit movement of the linking arm from the non-operated position to the operated position. The ejecting member is disposed in the housing adjacent to the ejector opening, and has a first pivot portion connected pivotally to the connecting end of the linking arm, a second pivot portion connected pivotally to the housing, and an ejecting portion that extends out of the housing via the ejector opening to push the rear wall away from the front wall when the linking arm is in the operated position. The operating member is disposed outside the housing adjacent to the access opening, and has a third pivot portion connected pivotally to the operating end of the linking arm and a fourth pivot portion connected pivotally to the housing. The biasing member is used for biasing the linking arm to the non-operated position.

18 Claims, 13 Drawing Sheets

DOCKING STATION FOR A NOTEBOOK COMPUTER

BACKGROUND OF THE INVENTION

1. Field of the Invention

The invention relates to a docking station for a notebook computer, more particularly to a docking station that facilitates detaching of the notebook computer from the docking station.

2. Description of the Related Art

A docking station is used with a notebook computer as a way of expanding the functions of the notebook computer. Because the docking station is connected electrically and mechanically to the notebook computer, there is always a need to facilitate detaching of the notebook computer from the docking station.

SUMMARY OF THE INVENTION

Therefore, the main object of the present invention is to provide a docking station that permits convenient removal of a notebook computer therefrom.

According to this invention, a docking station is adapted for use with a notebook computer that has a rear wall provided with a first connector set. The rear wall defines a longitudinal axis. The docking station comprises a housing and an ejector device.

The housing has a front wall adapted to be disposed adjacent to and parallel to the rear wall of the notebook computer. The front wall is provided with a second connector set that is adapted to connect electrically and mechanically with the first connector set. The front wall is formed with an ejector opening. The housing is further formed with an access opening, and has a lateral wall adjacent to the front wall and transverse to the front wall.

The ejector device includes an linking arm, an ejecting member, an operating member, and a biasing member. The linking arm is disposed in the housing. The linking arm is movable in the housing in a longitudinal direction between operated and non-operated positions. The linking arm has a connecting end and an operating end accessible via the access opening to permit movement of the linking arm from the non-operated position to the operated position. The ejecting member is disposed in the housing adjacent to the ejector opening. The ejecting member has a first pivot portion connected pivotally to the connecting end of the linking arm, a second pivot portion connected pivotally to the housing, and an ejecting portion that is retracted in the housing when the linking arm is in the non-operated position, and that extends out of the housing via the ejector opening so as to be adapted to push the rear wall of the notebook computer away from the front wall when the linking arm is in the operated position. The operating member is disposed outside the housing adjacent to the access opening. The operating member has a third pivot portion connected pivotally to the operating end of the linking arm and a fourth pivot portion connected pivotally to the housing. The biasing member is used for biasing the linking arm to the non-operated position.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
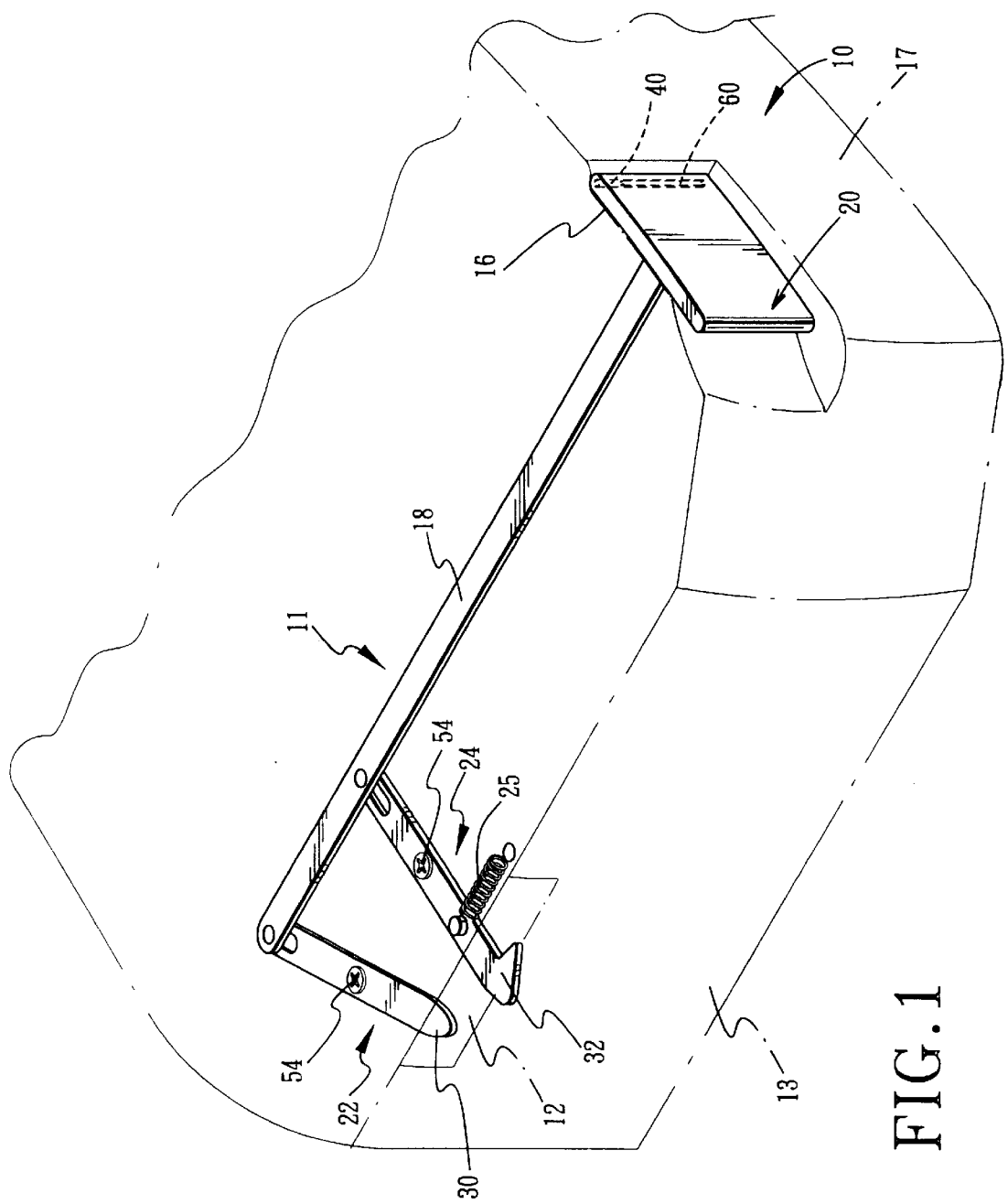
FIG. 1 is a fragmentary perspective view showing a first preferred embodiment of a docking station for a notebook computer according to this invention.
Figure 2:
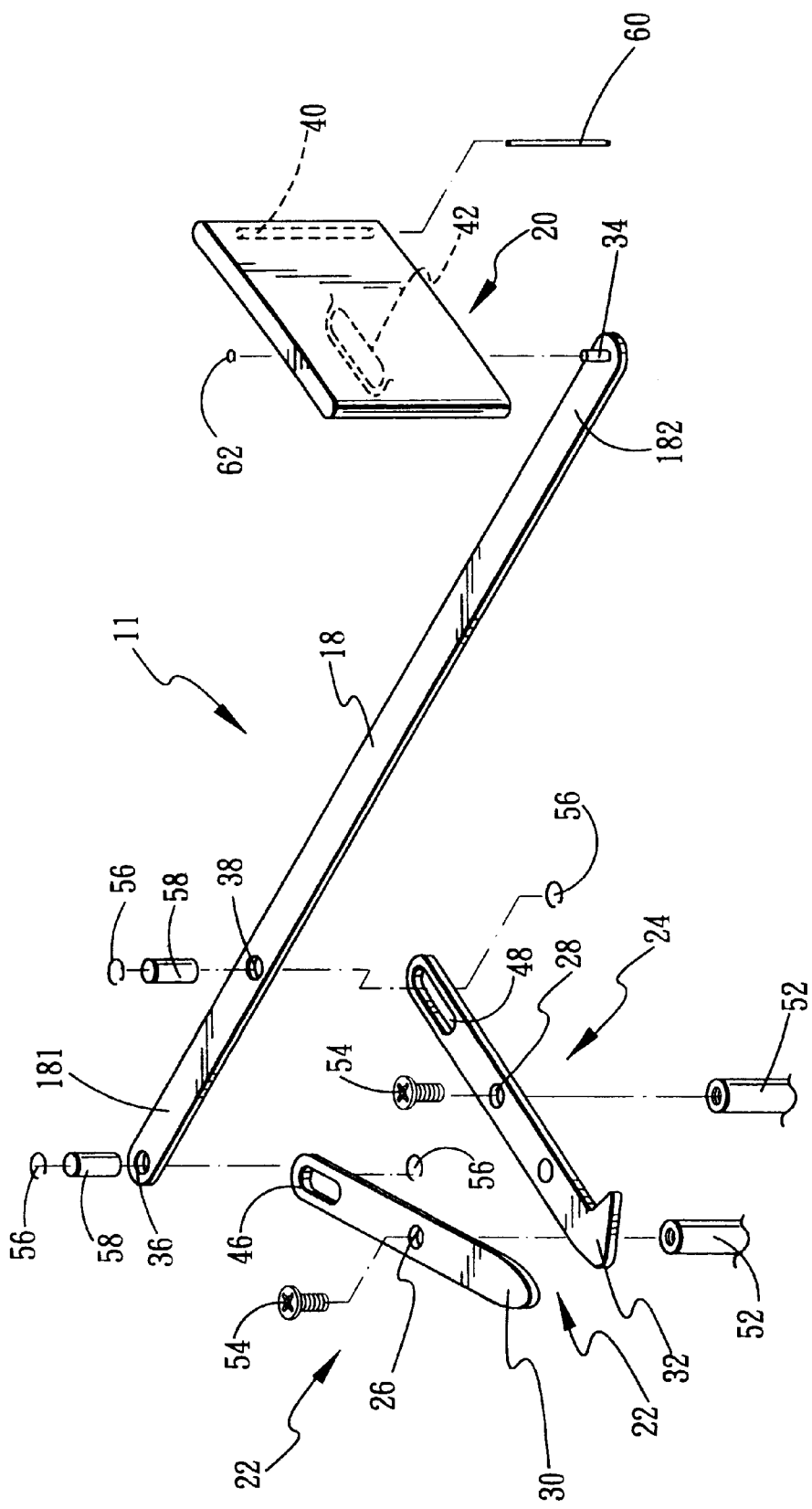
FIG. 2 is a fragmentary exploded perspective view showing the first preferred embodiment of this invention.
Figure 3:
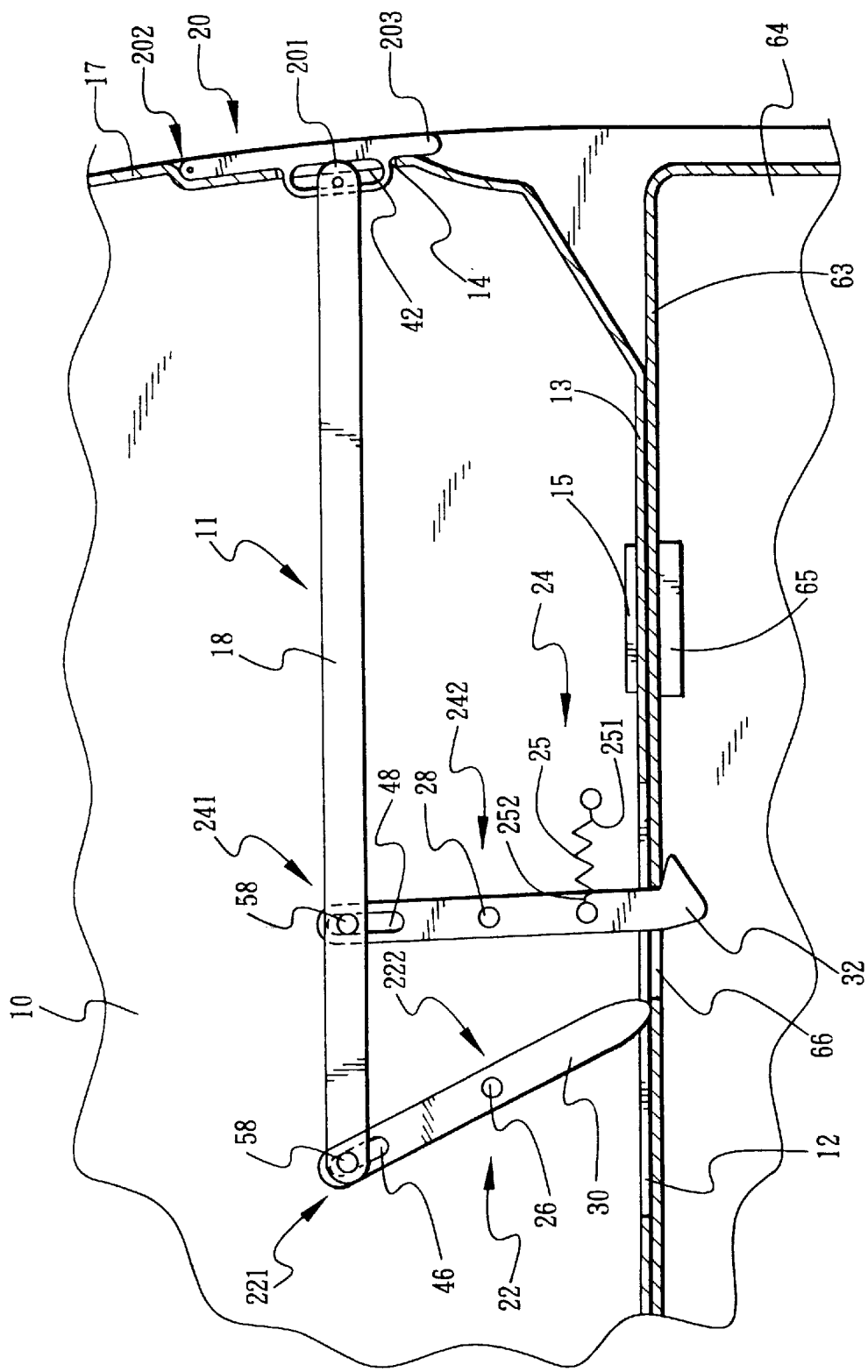
FIG. 3 is a schematic view showing the first preferred embodiment in a non-operated position.

Referring to FIGS. 1, 2, and 3, according to the first preferred embodiment of this invention, a docking station is adapted for use with a notebook computer 64 that has a rear wall 63 provided with a first connector set 65 and an engaging hole 66. The docking station comprises a housing 10 and an ejector device 11.

The housing 10 has a front wall 13 adapted to be disposed adjacent to and parallel to the rear wall 63 of the notebook computer 64. The front wall 13 is provided with a second connector set 15 that is adapted to connect electrically and mechanically with the first connector set 65. The front wall 13 formed with an ejector opening 12. The housing 10 is further formed with an access opening 14, and has a lateral wall 17 adjacent to the front wall 13 and transverse to the front wall 13. The access opening 14 is formed in the lateral wall 17.

Figure 4:
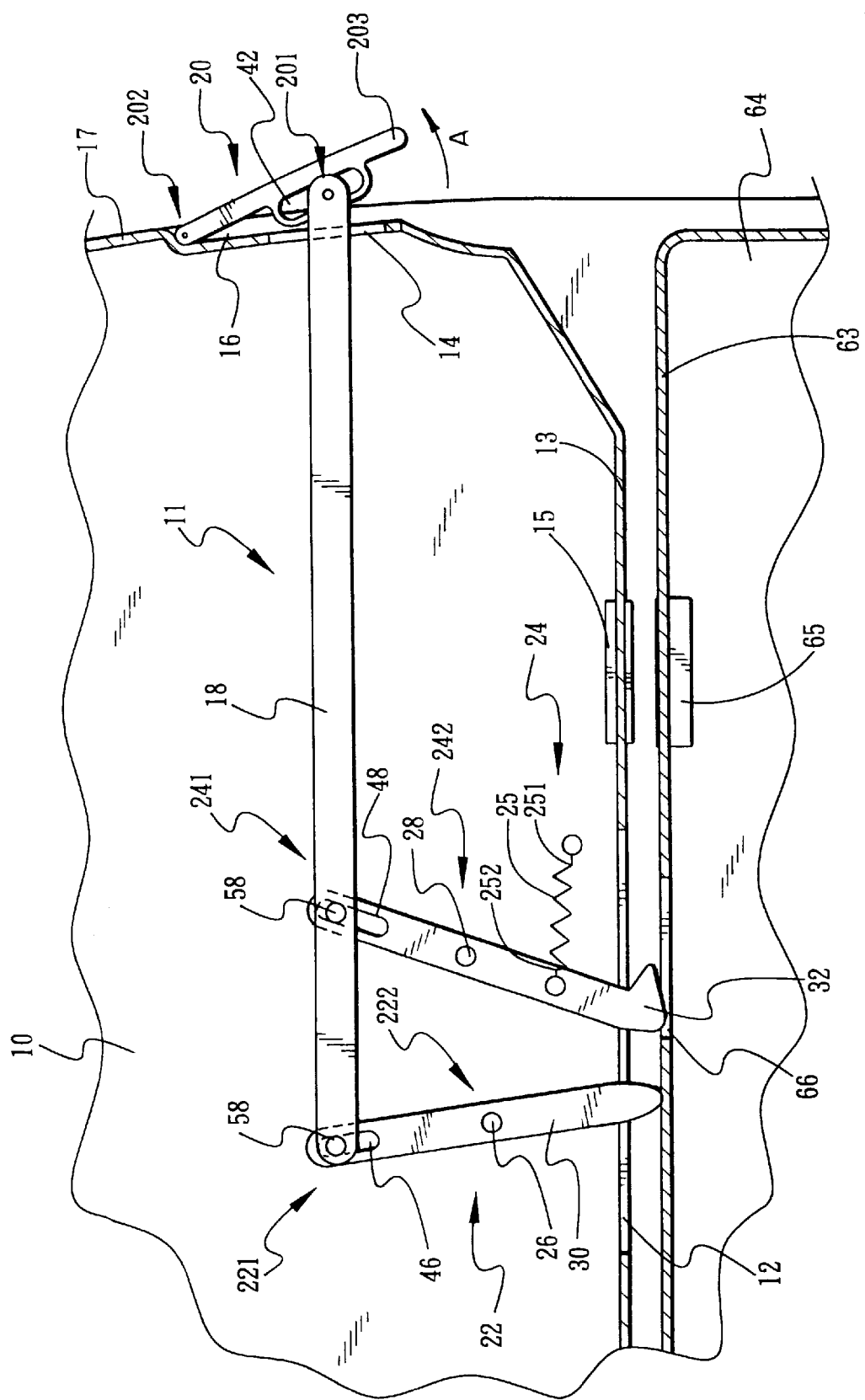
FIG. 4 is a schematic view showing the first preferred embodiment in an operated position.

The ejector device 11 includes a linking arm 18, an operating member 20, an ejecting member 22, a hooking member 24, and a coil spring 25. The linking arm 18 is disposed in the housing 10. The linking arm 18 is movable in the housing 10 in a longitudinal direction between operated and non-operated positions. The linking arm 18 has a connecting end 181 and an operating end 182 accessible via the access opening 14 to permit movement of the linking arm 18 from the non-operated position to the operated position. The operating member 20 is disposed outside the housing 10 in a recess 16 formed in the lateral wall 17. The operating member 20 has a third pivot portion 201 connected pivotally to the operating end 182 of the linking arm 18, and a fourth pivot portion 202 connected pivotally to the housing 10. The third pivot portion 201 and the fourth pivot portion 202 are pivotable about vertical axes transverse to the longitudinal direction. The operating member 20 is formed as a plate member with a first edge and an opposite second edge. The fourth pivot portion 202 is disposed on the first edge. The second edge serves as an operating portion 203 of the operating member 20 for causing the operating member 20 to pivot at the fourth pivot portion 202 relative to the housing 10 and move the linking arm 18 from the non-operated position to the operated position. The third pivot portion 201 is disposed between the fourth pivot portion 202 and the operating portion 203. In this embodiment, the operating member 20 has an inner wall surface formed with a slot 42 that extends in a horizontal direction transverse to the longitudinal direction. The operating end 182 of the linking arm 18 is provided with a guide pin 34 that extends into the slot 42 to couple pivotally the linking arm 18 to the third pivot portion 201 of the operating member 20, and a C-shaped engaging unit 62 that is mounted on the pin 34 to retain the third pivot portion 201. In this embodiment, a pin 60 extends into a pin hole 40 in the fourth pivot portion 202 and mounts pivotally the fourth pivot portion 202 on the housing 10. The ejecting member 22 is disposed in the housing 10 adjacent to the ejector opening 12. The ejecting member 22 has a first pivot portion 221, a second pivot portion 222, and an ejecting portion 30. The first pivot portion 221, the second pivot portion 222 and the ejecting portion 30 are disposed in substantially the same line. The second pivot portion 222 is disposed between the first pivot portion 221 and the ejecting portion 30. The first pivot portion 221 is connected pivotally to the connecting end 181 of the linking arm 18. In this embodiment, the first pivot portion 221 is formed with a slot 46. The connecting end 181 of the linking arm 18 is formed with a pivot hole 36, and is provided with a pivot pin 58 that extends into the pivot hole 36 and the slot 46 to couple pivotally the first pivot portion 221 to the linking arm 18, and two C-shaped engaging units 56 that are mounted on opposite ends of the pivot pin 58, respectively, to retain the first pivot portion 221 on the pin 58. The second pivot portion 222 is connected pivotally to the housing 10. In this embodiment, the housing 10 is formed with a socket 52 for mounting pivotally the second pivot portion 222. A screw 54 extends through a hole 26 in the ejecting member 22 and engages threadedly the socket 52. The hooking member 24 has a fifth pivot portion 241, a sixth pivot portion 242, and a hooking portion 32. The fifth pivot portion 241 is connected pivotally to the connecting end 181 of the linking arm 18. In this embodiment, the fifth pivot portion 241 is formed with a slot 48. The connecting end 181 of the linking arm 18 is formed with a pivot hole 38, and is provided with a pivot pin 58 that extends into the pivot hole 38 and the slot 48 to couple pivotally the fifth pivot portion 241 to the linking arm 18, and two C-shaped engaging units 56 that are mounted on opposite ends of the pivot pin 58, respectively, to retain the fifth pivot portion 241 on the pin 58. The sixth pivot portion 242 is connected pivotally to the housing 10. In the embodiment, the housing 10 is formed with a socket 52 for mounting pivotally the second pivot portion 242. A screw 54 extends through a hole 28 in the hooking member 24 and engages threadedly the socket 52. The fifth pivot portion 241, the sixth pivot portion 242 and the hooking portion 32 are disposed in substantially the same line. The sixth pivot portion 242 is disposed between the fifth pivot portion 241 and the hooking portion 32. The ejecting portion 30 is retracted in the housing 10, and the hooking portion 32 extends out of the housing 10 via the ejector opening 12 so as to engage the engaging hole 66 in the rear wall 63 of the notebook computer 64 when the linking arm 18 is in the non-operated position, as best illustrated in FIG. 3. The ejecting portion 30 extends out of the housing 10 via the ejector opening 12 so as to be adapted to push the rear wall 63 of the notebook computer 64 away from the front wall 13, and the hooking portion 32 is retracted in the housing 10 when the linking arm 18 is in the operated position, i.e., the operating portion 203 of the operating member 20 is pulled in the direction of the arrow (A) as shown in FIG. 4. The coil spring 25 provides a biasing force for biasing the linking arm 18 to the non-operated position. In this embodiment, the coil spring 25 has a first end 251 mounted on the housing 10 and an opposite second end 252 mounted on the hooking member 24 adjacent to the hooking portion 32. Alternatively, the second end 252 of the coil spring 25 may be mounted on the ejecting member 22 adjacent to the ejecting portion 30. The coil spring 25 pulls the hooking member 24 to extend the hooking portion 32 out of the housing 10 and, in turn, bias the linking arm 18 to the non-operated position.

Figure 5:
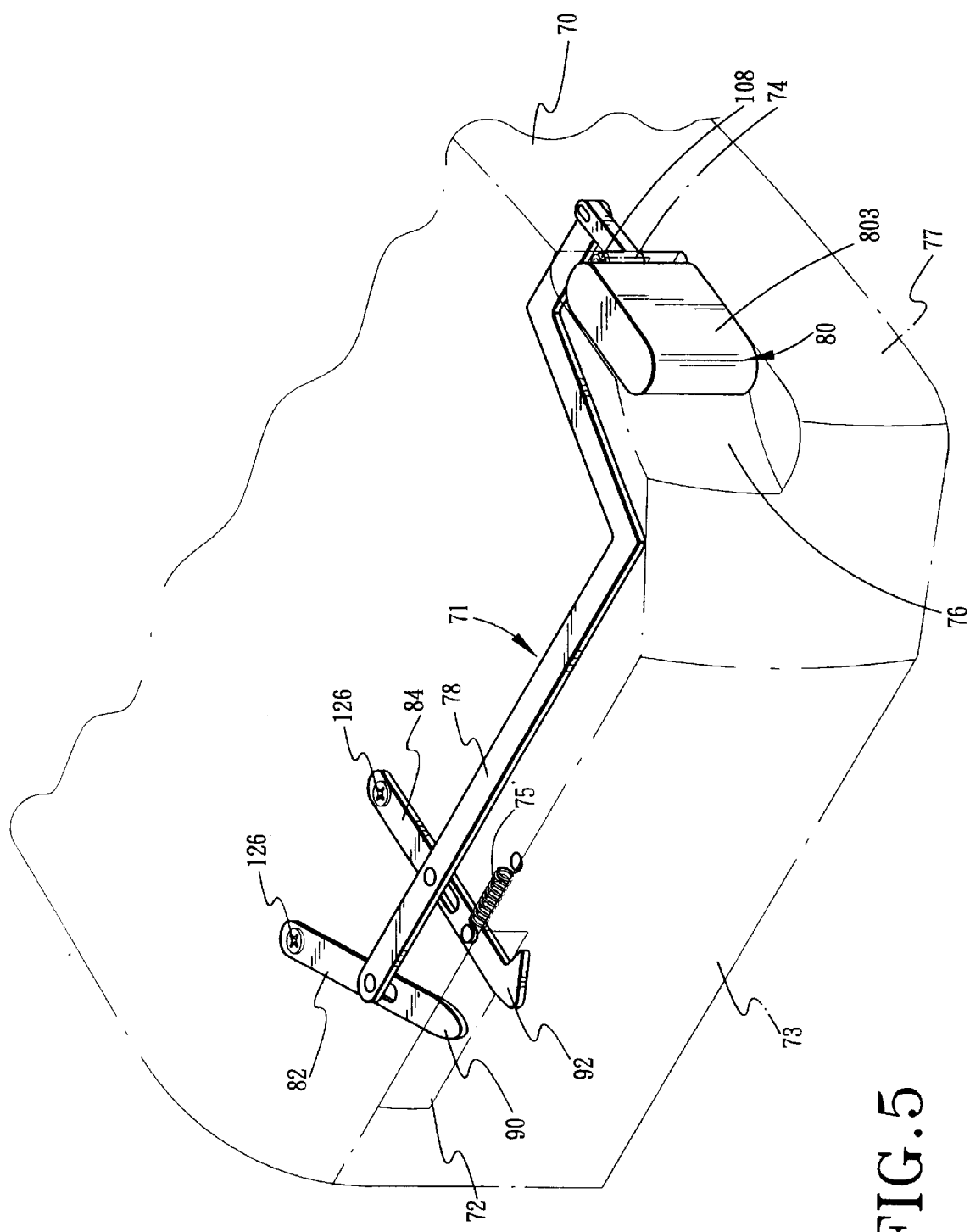
FIG. 5 is a fragmentary perspective view showing a second preferred embodiment of this invention.
Figure 6:
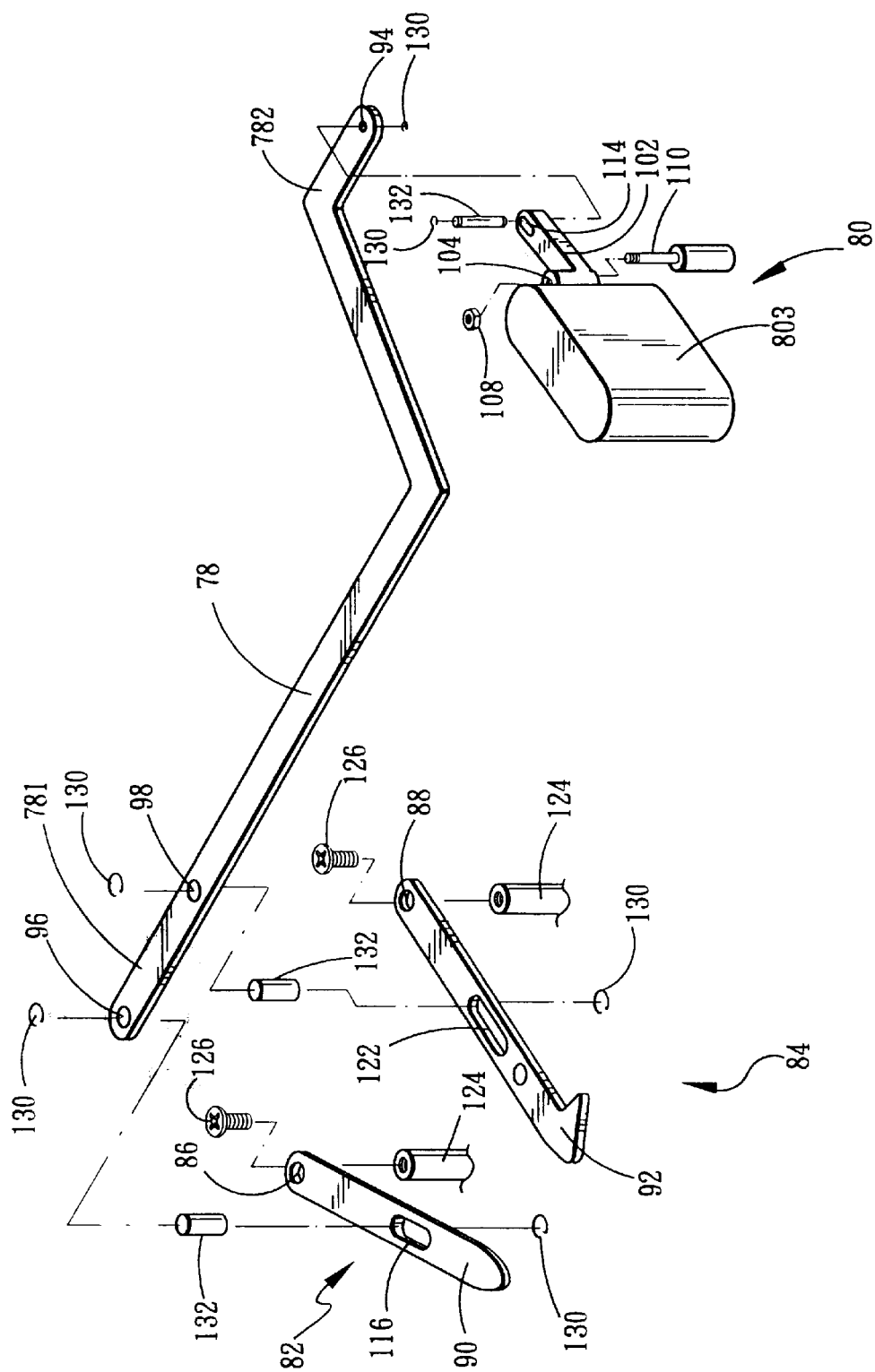
FIG. 6 is a fragmentary exploded perspective view showing the second preferred embodiment of this invention.
Figure 7:
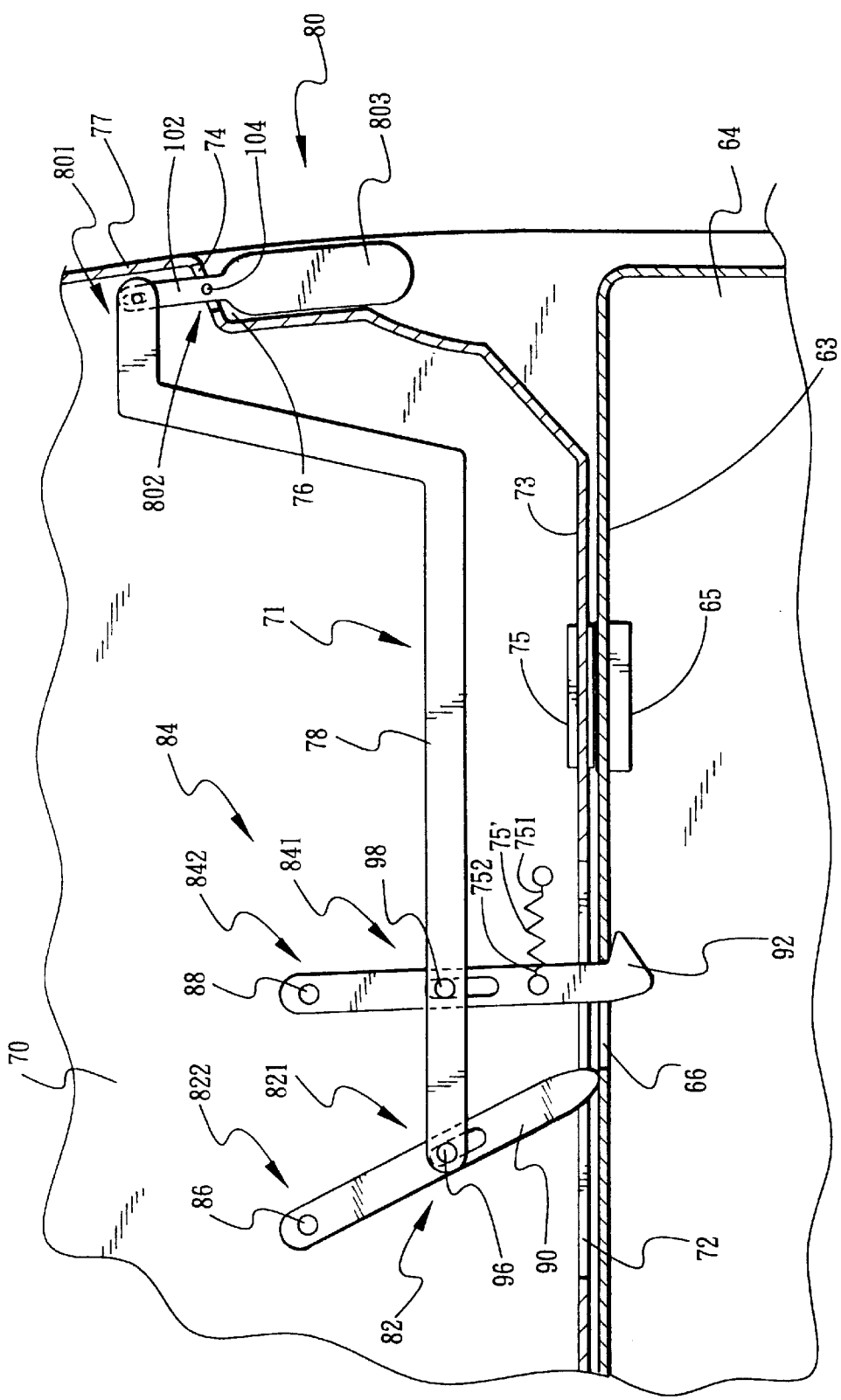
FIG. 7 is a schematic view showing the second preferred embodiment in a non-operated position.

Referring to FIGS. 5, 6, and 7, according to the second preferred embodiment of this invention, a docking station is adapted for use with a notebook computer 64 that has a rear wall 63 provided with a first connector set 65 and an engaging hole 66. The docking station comprises a housing 70 and an ejector device 71.

The housing 70 has a front wall 73 adapted to be disposed adjacent to and parallel to the rear wall 63 of the notebook computer 64. The front wall 73 is provided with a second connector set 75 that is adapted to connect electrically and mechanically with the first connector set 65. The front wall 73 formed with an ejector opening 72. The housing 70 is further formed with an access opening 74, and has a lateral wall 77 adjacent to the front wall 73 and transverse to the front wall 73. The access opening 74 is formed in the lateral wall 77.

The ejector device 71 includes a linking arm 78, an operating member 80, an ejecting member 82, a hooking member 84, and a coil spring 75'. The linking arm 78 is disposed in the housing 70, and is movable in the housing 70 in a longitudinal direction between operated and non-operated positions. The linking arm 78 has a connecting end 781 and an operating end 782. The operating member 80 is disposed outside the housing 70 in a recess 76 formed in the lateral wall 77. The operating member 80 has a third pivot portion 801 connected pivotally to the operating end 782 of the linking arm 78 and a fourth pivot portion 802 connected pivotally to the housing 70. The third pivot portion 801 and the fourth pivot portion 802 are pivotable about vertical axes transverse to the longitudinal direction. The operating member 80 is formed as a plate member with a first edge and an opposite second edge. The fourth pivot portion 802 is disposed on the first edge. The fourth pivot portion 802 is formed with a extension 102 that extends into the housing 70 via the access opening 74 and that serves as the third pivot portion 801. The second edge serves as an operating portion 803 of the operating member 80 for causing the operating member 80 to pivot at the fourth pivot portion 802 relative to the housing 70 and move the linking arm 78 from the non-operated position to the operated position. The fourth pivot portion 802 is disposed between the third pivot portion 801 and the operating portion 803. In this embodiment, the third pivot portion 801 is formed with a slot 114. The operating end 782 of the linking arm 78 is provided with a pin 132 that extends into a hole 94 in the linking arm 78 and the slot 114 to couple pivotally the linking arm 78 to the third pivot portion 801 of the operating member 80, and two C-shaped engaging units 130 that are mounted on opposite ends of the pin 132,respectively, to retain the third pivot portion 801. In this embodiment, the housing 70 is formed with a pin 110 that extends through a pin hole 104 in the fourth pivot portion 802, and an engaging unit 108 mounted threadedly on the pin 110. The ejecting member 82 is disposed in the housing 70 adjacent to the ejector opening 72. The ejecting member 82 has a first pivot portion 821, a second pivot portion 822, and an ejecting portion 90. The first pivot portion 821, the second pivot portion 822 and the ejecting portion 90 are disposed in substantially the same line. The first pivot portion 821 is disposed between the second pivot portion 822 and the ejecting portion 90, and is connected pivotally to the connecting end 781 of the linking arm 78. In this embodiment, the first pivot portion 821 is formed with a slot 116. The connecting end 781 of the linking arm 78 is formed with a pivot hole 96, and is provided with a pivot pin 132 that extends into the pivot hole 96 and the slot 116 to couple pivotally the first pivot portion 821 to the linking arm 78, and two C-shaped engaging units 130 that are mounted on opposite ends of the pivot pin 132, respectively, to retain the first pivot portion 821 on the pin 132. The second pivot portion 822 is connected pivotally to the housing 70. In this embodiment, the housing 70 is formed with a socket 124 for mounting pivotally the second pivot portion 822. A screw 126 extends through a hole 86 in the ejecting member 82 and engages threadedly the socket 124. The hooking member 84 has a fifth pivot portion 841, a sixth pivot portion 842, and a hooking portion 92. The fifth pivot portion 841 is connected pivotally to the connecting end 781 of the linking arm 78. In this embodiment, the fifth pivot portion 841 is formed with a slot 122. The connecting end 781 of the linking arm 78 is formed with a pivot hole 98, and is provided with a pivot pin 132 that extends into the pivot hole 98 and the slot 122 to couple pivotally the fifth pivot portion 841 to the linking arm 78, and two C-shaped engaging units 130 that are mounted on opposite ends of the pivot pin 132, respectively, to retain the fifth pivot portion 841 on the pin 132. The sixth pivot portion 842 is connected pivotally to the housing 70.

Figure 8:
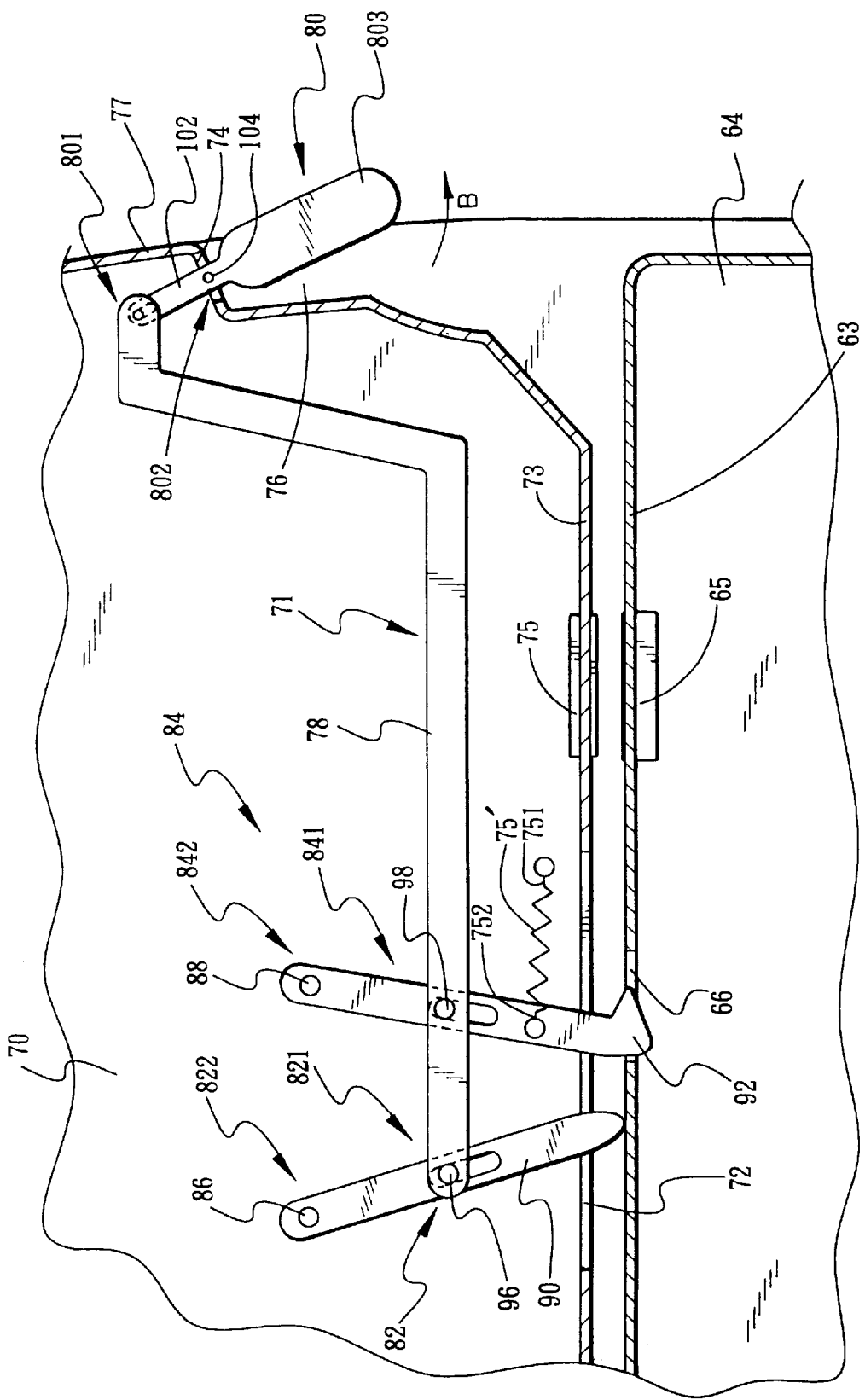
FIG. 8 is a schematic view showing the second preferred embodiment in an operated position.

In the embodiment, the housing 70 is formed with a socket 124 for mounting pivotally the second pivot portion 842. A screw 126 extends through a hole 88 in the hooking member 84 and engages threadedly the socket 124. The fifth pivot portion 841, the sixth pivot portion 842 and the hooking portion 92 are disposed in substantially the same line. The fifth pivot portion 841 is disposed between the sixth pivot portion 842 and the hooking portion 92. The ejecting portion 90 is retracted in the housing 70, and the hooking portion 92 extends out of the housing 70 via the ejector opening 72 so as to engage the engaging hole 66 in the rear wall 63 of the notebook computer 64 when the linking arm 78 is in the non-operated position, as best illustrated in FIG. 7. The ejecting portion 90 extends out of the housing 70 via the ejector opening 72 so as to be adapted to push the rear wall 63 of the notebook computer 64 away from the front wall 73, and the hooking portion 92 is retracted in the housing 70 when the linking arm 78 is in the operated position, i.e., the operating portion 803 of the operating member 80 is pulled in the direction of the arrow (B) as shown in FIG. 8. The coil spring 75' provides a biasing force for biasing the linking arm 78 to the non-operated position. In this embodiment, the coil spring 75' has a first end 751 mounted on the housing 70 and an opposite second end 752 mounted on the hooking member 84 adjacent to the hooking portion 92. Alternatively, the second end 752 of the coil spring 75 may be mounted on the ejecting member 82 adjacent to the ejecting portion 90. The coil spring 75' pulls the hooking member 84 to extend the hooking portion 92 out of the housing 70 and, in turn, bias the linking arm 78 to the non-operated position.

Figure 10:
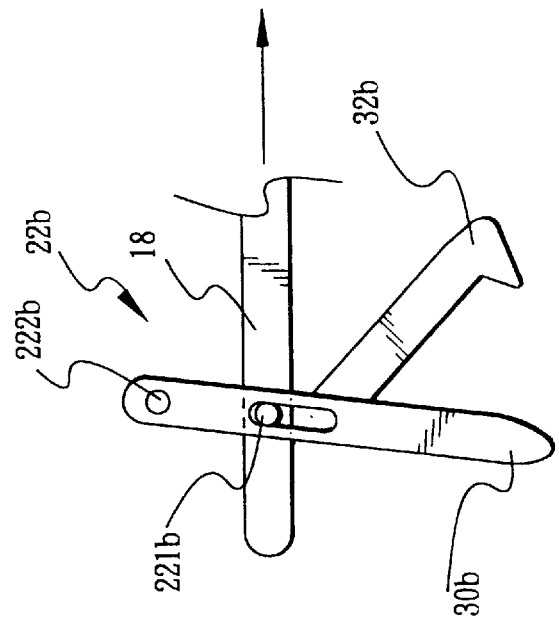
FIGS. 9 to 13 are fragmentary schematic views that respectively show third to seventh preferred embodiments of this invention, which are based on the first preferred embodiment.
Figure 9:
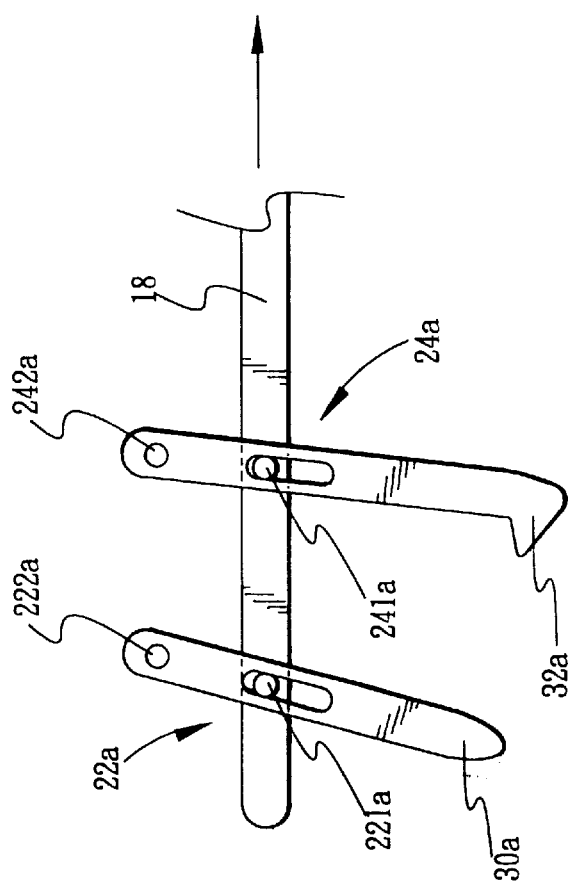
Figure 12:
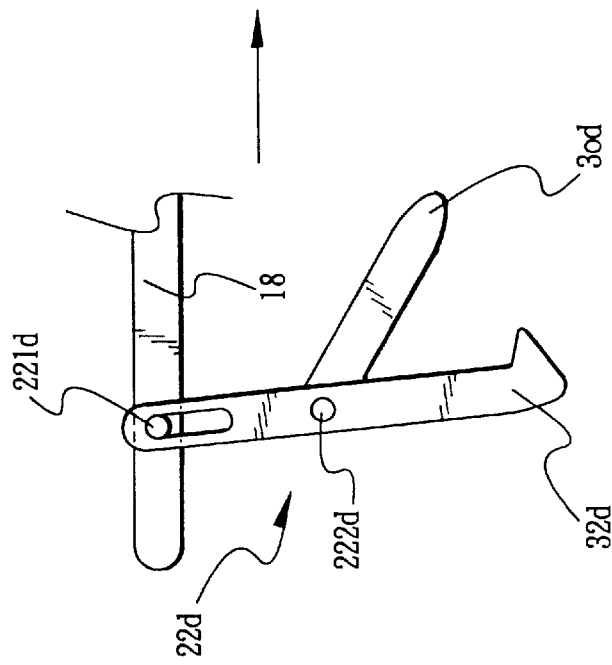
Figure 11:
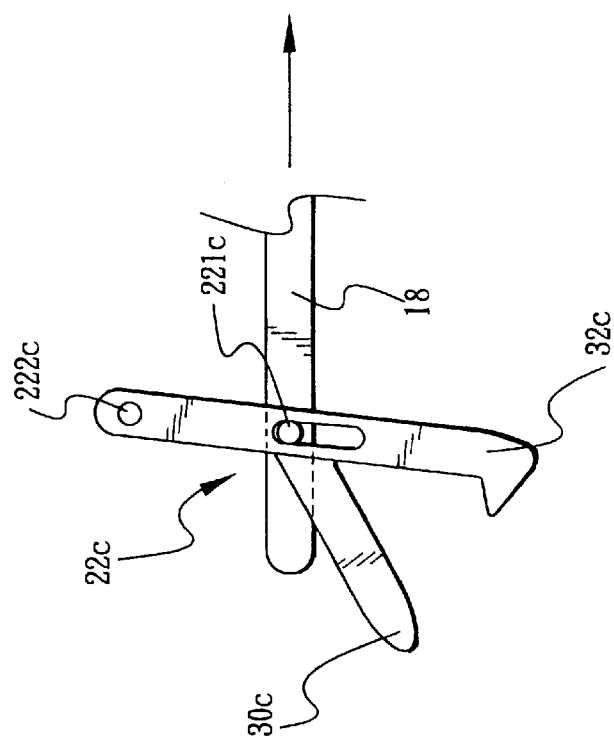
Figure 13:
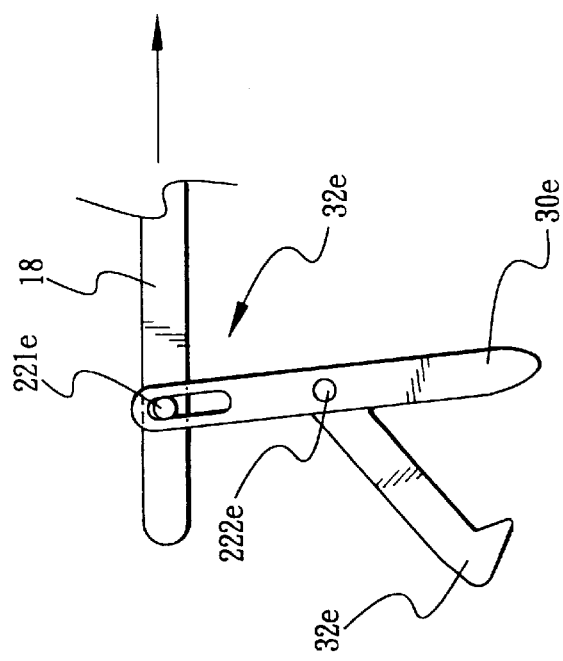

FIGS. 9 to 13 respectively illustrate the third to seventh preferred embodiments of this invention, which are based on the first preferred embodiment. In FIG. 9, like the first preferred embodiment, the first pivot portion 221a, the second pivot portion 222a and the ejecting portion 30a of an ejecting member 22a are disposed in substantially the same line. However, the first pivot portion 221a is disposed between the second pivot portion 222a and the ejecting portion 30a. The fifth pivot portion 241a, the sixth pivot portion 242a and the hooking portion 32a of a hooking member 24a are also disposed in substantially the same line on the right side of the ejecting member 22a. The fifth pivot portion 241a is disposed between the sixth pivot portion 242a and the hooking portion 32a. In FIG. 10, the first pivot portion 221b, the second pivot portion 222b and the ejecting portion 30b of an ejecting member 22b are disposed in substantially the same line. The first pivot portion 221b is disposed between the second pivot portion 222b and the ejecting portion 30b. Instead of a hooking member, a hooking portion 32b is disposed on the right of the ejecting portion 30b and forms an angle with the ejecting portion 30b. In FIG. 11, the first pivot portion 221c, the second pivot portion 222c and the hooking portion 32c of an ejecting member 22c are disposed in substantially the same line. The first pivot portion 221c is disposed between the second pivot portion 222c and the hooking portion 32c. The ejecting portion 30c is disposed on the left of the hooking portion 32c and forms an angle with the hooking portion 32c. In FIG. 12, the first pivot portion 221d, the second pivot portion 222d and the hooking portion 32d of an ejecting member 22d are disposed in substantially the same line. The second pivot portion 222d is disposed between the first pivot portion 221d and the hooking portion 32d. The ejecting portion 30d is disposed on the right of the hooking portion 32d and forms an angle with the hooking portion 32d. The direction of the hook end of the hooking portion 32d differs from that of the hooking portion 32c of FIG. 12. In FIG. 13, the first pivot portion 221e, the second pivot portion 222e and the ejecting portion 30e of an ejecting member 22e are disposed in substantially the same line. The hooking portion 32e is disposed on the left of the ejecting portion 30e and forms an angle with the ejecting portion 30e.

Figure 14:
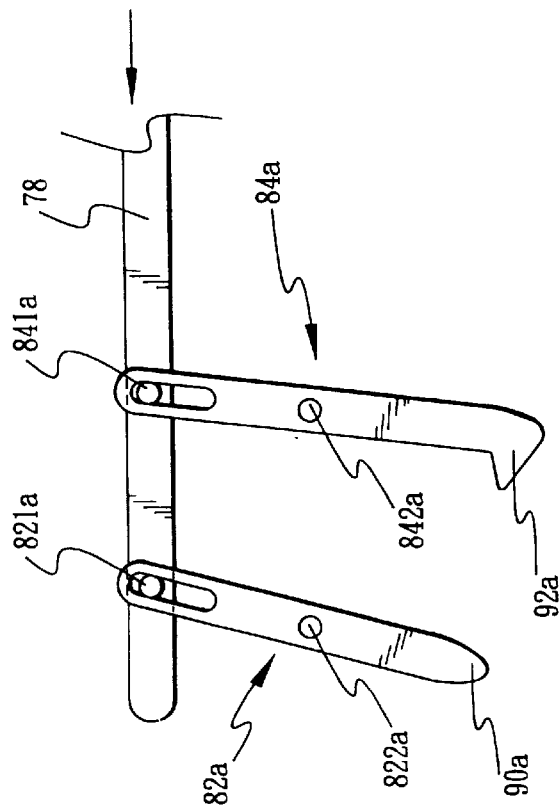
FIGS. 14 to 18 are fragmentary schematic views that respectively show eighth to twelfth preferred embodiments of this invention, which are based on the second preferred embodiment, respectively.
Figure 16:
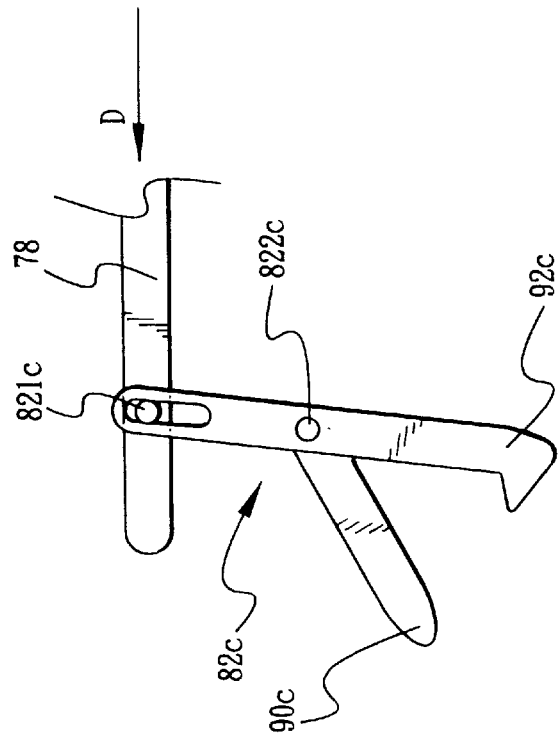
Figure 15:
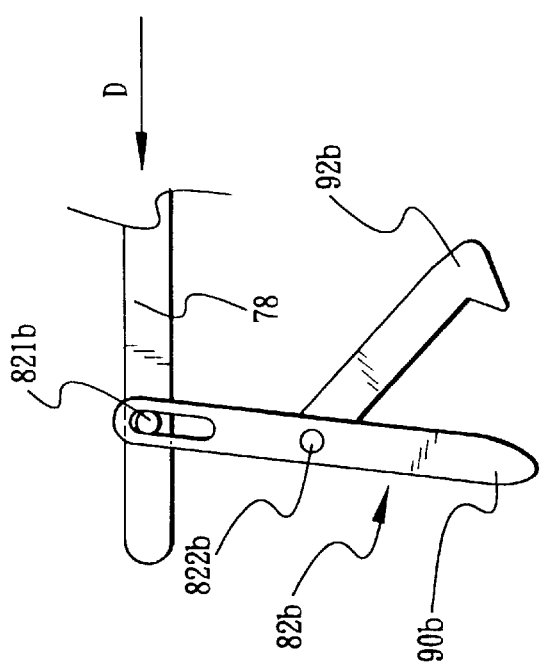
Figure 18:
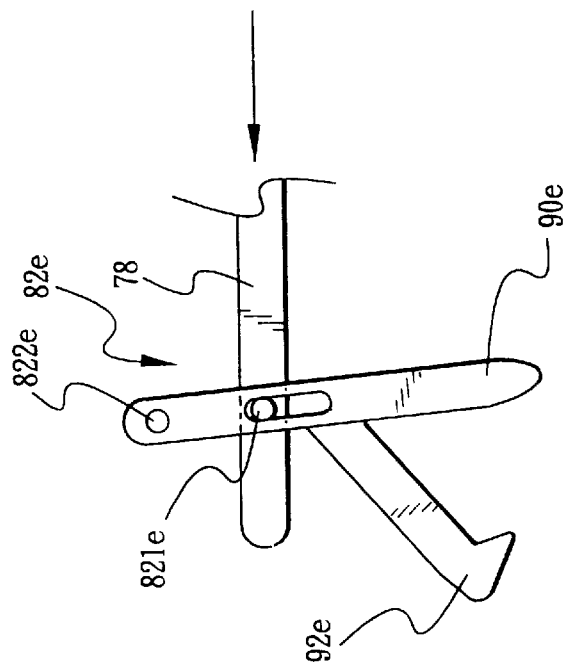
Figure 17:
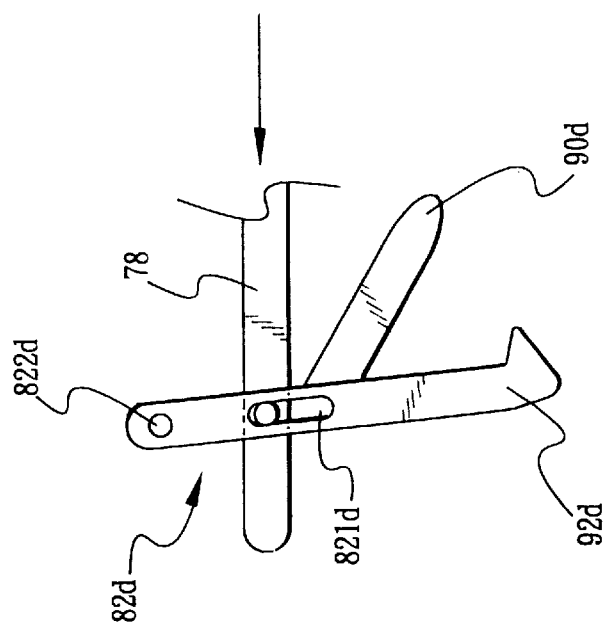

FIGS. 14 to 18 respectively illustrate the eighth to twelfth preferred embodiments of this invention, which are based on the second preferred embodiment. In FIG. 14, like the second preferred embodiment, the first pivot portion 821a, the second pivot portion 822a and the ejecting portion 90a of an ejecting member 82a are disposed in substantially the same line. However, the second pivot portion 822a is disposed between the first pivot portion 821a and the ejecting portion 90a. The fifth pivot portion 841a, the sixth pivot portion 842a and the hooking portion 92a of a hooking member 84a are also disposed in substantially the same line on the right side of the ejecting member 82a. The sixth pivot portion 842a is disposed between the fifth pivot portion 841a and the hooking portion 92a. The direction of the hook end of the hooking portion 92a differs from that of the hooking portion 92 of FIG. 5. In FIG. 15, the first pivot portion 821b, the second pivot portion 822b and the ejecting portion 90b of an ejecting member 82b are disposed in substantially the same line. The second pivot portion 822b is disposed between the first pivot portion 821b and the ejecting portion 90b. Instead of a hooking member, a hooking portion 92b is disposed on the right of the ejecting portion 90b and forms an angle with the ejecting portion 90b. In FIG. 16, the first pivot portion 821c, the second pivot portion 822c and the hooking portion 92c of an ejecting member 82c are disposed in substantially the same line. The second pivot portion 822c is disposed between the first pivot portion 821c and the hooking portion 92c. The ejecting portion 90c is disposed on the left of the hooking portion 92c and forms an angle with the hooking portion 92c. In FIG. 17, the first pivot portion 821d, the second pivot portion 822d and the hooking portion 92d of an ejecting member 82d are disposed in substantially the same line. The first pivot portion 821d is disposed between the second pivot portion 822d and the hooking portion 92d. The ejecting portion 90d is disposed on the right of the hooking portion 92d and forms an angle with the hooking portion 92d. The direction of the hook end of the hooking portion 92d differs from that of the hooking portion 92c of FIG. 16. In FIG. 18, the first pivot portion 821e, the second pivot portion 822e and the ejecting portion 90e of an ejecting member 82e are disposed in substantially the same line. The hooking portion 92e is disposed on the left of the ejecting portion 90e and forms an angle with the ejecting portion 90e.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A docking station for a notebook computer that has a rear wall provided with a first connector set, the rear wall defining a longitudinal axis, said docking station comprising:

a housing having a front wall adapted to be disposed adjacent to and parallel to the rear wall of the notebook computer, said front wall being provided with a second connector set that is adapted to connect electrically and mechanically with the first connector set, said front wall being formed with an ejector opening, said housing being further formed with an access opening and having a lateral wall adjacent to said front wall and transverse to said front wall; and an ejector device including a linking arm disposed in said housing, said linking arm being movable in said housing in a longitudinal direction between operated and non-operated positions, said linking arm having a connecting end and an operating end accessible via said access opening to permit movement of said linking arm from the non-operated position to the operated position, an ejecting member disposed in said housing adjacent to said ejector opening, said ejecting member having a first pivot portion connected pivotally to said connecting end of said linking arm, a second pivot portion connected pivotally to said housing, and an ejecting portion that is retracted in said housing when said linking arm is in the non-operated position, and that extends out of said housing via said ejector opening so as to be adapted to push the rear wall of the notebook computer away from said front wall when said linking arm is in the operated position, an operating member disposed outside said housing adjacent to said access opening, said operating member having a third pivot portion connected pivotally to said operating end of said linking arm and a fourth pivot portion connected pivotally to said housing, and a biasing member for biasing said linking arm to the non-operated position.

2. The docking station as claimed in claim 1, wherein said operating member is formed as a plate member with opposite edges, said fourth pivot portion being disposed on one of said edges, the other one of said edges serving as an operating portion of said operating member for causing said operating member to pivot at said fourth pivot portion relative to said housing and move said linking arm from the non-operated position to the operated position.

3. The docking station as claimed in claim 2, wherein said access opening is formed in said lateral wall.

4. The docking station as claimed in claim 3, wherein said lateral wall is formed with a recess having said operating member disposed therein.

5. The docking station as claimed in claim 3, wherein said third pivot portion and said fourth pivot portion are pivotable about vertical axes transverse to the longitudinal direction.

6. The docking station as claimed in claim 5, wherein said third pivot portion is disposed between said fourth pivot portion and said operating portion.

7. The docking station as claimed in claim 6, wherein said operating member is formed with a slot that extends in a horizontal direction transverse to the longitudinal direction, said operating end of said linking arm being provided with a guide pin that extends into said slot to couple pivotally said linking arm and said operating member.

8. The docking station as claimed in claim 5, wherein said fourth pivot portion is formed with an extension that extends into said housing via said access opening and that serves as said third pivot portion.

9. The docking station as claimed in claim 1, wherein said second pivot portion of said ejecting member is disposed between said first pivot portion and said ejecting portion.

10. The docking station as claimed in claim 1, wherein said ejecting member further has a hooking portion that is retracted in said housing when said linking arm is in the operated position, and that extends out of said housing via said ejector opening so as to be adapted to engage the rear wall of the notebook computer when said linking arm is in the non-operated position.

11. The docking station as claimed in claim 10, wherein said first pivot portion, said second pivot portion and said ejecting portion are disposed in substantially the same line, said hooking portion forming an angle with said ejecting portion.

12. The docking station as claimed in claim 10, wherein said first pivot portion, said second pivot portion and said hooking portion are disposed in substantially the same line, said hooking portion forming an angle with said ejecting portion.

13. The docking station as claimed in claim 1, wherein said first pivot portion of said ejecting member is disposed between said second pivot portion and said ejecting portion.

14. The docking station as claimed in claim 1, further comprising a hooking member having a fifth pivot portion connected pivotally to said connecting end of said linking arm, a sixth pivot portion connected pivotally to said housing, and a hooking portion that is retracted in said housing when said linking arm is in the operated position, and that extends out of said housing via said ejector opening so as to be adapted to engage the rear wall of the notebook computer when said linking arm is in the nonoperated position.

15. The docking station as claimed in claim 14, wherein said biasing member includes a coil spring having a first end mounted on said housing and an opposite second end mounted on said hooking member, said coil spring pulling said hooking member to extend said hooking portion out of said housing and, in turn, bias said linking arm to the non-operated position.

16. The docking station as claimed in claim 15, wherein said second end of said coil spring is mounted on said hooking member adjacent to said hooking portion.

17. The docking station as claimed in claim 14, wherein said fifth pivot portion of said hooking member is disposed between said sixth pivot portion and said hooking portion.

18. The docking station as claimed in claim 14, wherein said sixth pivot portion of said hooking member is disposed between said fifth pivot portion and said hooking portion.

* * * * *